United States Patent
Kuit et al.

(10) Patent No.: US 8,634,058 B2
(45) Date of Patent: Jan. 21, 2014

(54) LITHOGRAPHIC APPARATUS AND DEVICE MANUFACTURING METHOD

(75) Inventors: Jan-Jaap Kuit, Veldhoven (NL); Paulus Martinus Maria Liebregts, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 615 days.

(21) Appl. No.: 12/579,083

(22) Filed: Oct. 14, 2009

(65) Prior Publication Data

US 2010/0097586 A1    Apr. 22, 2010

Related U.S. Application Data

(60) Provisional application No. 61/136,943, filed on Oct. 16, 2008.

(51) Int. Cl.
*G02B 27/42* (2006.01)
*G03F 7/20* (2006.01)

(52) U.S. Cl.
CPC ............................... *G03F 7/70341* (2013.01)
USPC .................................. 355/53; 355/55; 355/72

(58) Field of Classification Search
CPC ........................ G03F 7/70341; G03F 7/70725
USPC ..................... 355/30, 53, 55, 67, 72
See application file for complete search history.

(56) References Cited

U.S. PATENT DOCUMENTS

| | | | |
|---|---|---|---|
| 4,509,852 A | 4/1985 | Tabarelli et al. | |
| 6,937,318 B2* | 8/2005 | Van De Nieuwelaar | 355/53 |
| 2004/0136494 A1 | 7/2004 | Lof et al. | |
| 2004/0207824 A1 | 10/2004 | Lof et al. | |
| 2006/0098177 A1* | 5/2006 | Nagasaka | 355/53 |
| 2006/0119809 A1 | 6/2006 | Verhagen et al. | |
| 2006/0177776 A1* | 8/2006 | Matsunaga et al. | 430/322 |
| 2006/0290908 A1* | 12/2006 | De Graaf et al. | 355/53 |
| 2007/0109517 A1* | 5/2007 | Takaiwa et al. | 355/53 |

FOREIGN PATENT DOCUMENTS

| | | |
|---|---|---|
| EP | 1 420 300 | 5/2004 |
| JP | 2005-223315 | 8/2005 |
| JP | 2007-194484 | 8/2007 |
| JP | 2008-047847 | 2/2008 |
| JP | 2008-124194 | 5/2008 |
| WO | WO 99/49504 A1 | 9/1999 |
| WO | WO 2005/064405 A2 | 7/2005 |

OTHER PUBLICATIONS

Japanese Office Action dated Oct. 27, 2011 in corresponding Japanese Patent Application No. 2009-234674.
Japanese Office Action mailed Jun. 28, 2012 in corresponding Japanese Patent Application No. 2009-234674.

* cited by examiner

*Primary Examiner* — Steven H Whitesell Gordon
(74) *Attorney, Agent, or Firm* — Pillsbury Winthrop Shaw Pittman LLP

(57) ABSTRACT

An immersion lithographic apparatus is provided in which a maximum permissible velocity of the substrate relative to a fluid confinement structure that controls the immersion fluid is determined based on a property of the substrate to be exposed and, during the exposure process, the velocity of the substrate relative to the fluid confinement structure is limited to be below this maximum permissible velocity.

19 Claims, 6 Drawing Sheets

LITHOGRAPHIC APPARATUS AND DEVICE MANUFACTURING METHOD

This application claims priority and benefit under 35 U.S.C. §119(e) to U.S. Provisional Patent Application No. 61/136,943, entitled "Lithographic Apparatus and Device Manufacturing Method", filed on Oct. 16, 2008. The content of that application is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

In an immersion apparatus, immersion liquid is handled by a fluid handling system or apparatus. In an embodiment the fluid handling system may supply immersion fluid and therefore be a fluid supply system. In an embodiment the fluid handling system may confine fluid and thereby be a fluid confinement system, for example having a fluid confinement structure. In an embodiment the fluid handling system may provide a barrier to fluid and thereby be a barrier member. In an embodiment the fluid handling system may create or use a flow of fluid (such as gas), for example to help in handling liquid. In an embodiment, immersion liquid may be used as the immersion fluid. In that case, the fluid handling system may be a liquid handling system.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT Patent Application Publication No. WO 99/49504. As illustrated in FIGS. 2 and 3, liquid is supplied by at least one inlet IN onto the substrate W, preferably along the direction of movement of the substrate W relative to the final element, and is removed by at least one outlet OUT after having passed under the projection system PS. That is, as the substrate W is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate W relative to the final element, though this does not need to be the case. Various orientations and numbers of in- and out-lets positioned around the final element are possible, one example is illustrated in FIG. 3 in which four sets of an inlet IN with an outlet OUT on either side are provided in a regular pattern around the final element.

A further immersion lithography solution with a localized liquid supply system is shown in FIG. 4. Liquid is supplied by two groove inlets IN on either side of the projection system PS and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PS and removed by a plurality of discrete outlets OUT on the other side of the projection system PS, causing a flow of a thin film of liquid between the projection system PS and the substrate W. The choice of which combination of inlet IN and outlets OUT to use can depend on the direction of movement of the substrate W (the other combination of inlet IN and outlets OUT being inactive).

In European Patent Application Publication No. EP 1420300 and United States Patent Application Publication No. US 2004-0136494, the idea of a twin or dual stage immersion lithography apparatus is disclosed. Such an apparatus is provided with two tables for supporting a substrate. Levelling measurements are carried out with a table at a first position, without immersion liquid, and exposure is carried out with a table at a second position, where immersion liquid is present. Alternatively, the apparatus has only one table.

PCT Patent Application Publication No. WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States Patent Application Publication No. US 2006/0119809. A member is provided which covers the substrate in all positions and which is arranged to have immersion liquid extending between it and the top surface of the substrate and/or substrate table which holds the substrate.

As explained above, an immersion lithographic apparatus, namely a lithographic apparatus utilising an immersion fluid between the final element of the projection system and the substrate, may be configured such that the substrate is scanned relative to the projection system. In an immersion lithographic apparatus with a localized liquid supply system, for example, this movement of the substrate relative to the projection system should be carefully controlled. In particular, for example, care should be taken in relation to the meniscus of the immersion fluid at the leading and trailing edge of the space within which the immersion fluid is contained.

SUMMARY

Therefore, great care should be exercised when setting the operating conditions of the apparatus. For example, if the relative speed of the substrate and the projection system is too great, immersion fluid may be lost, namely may not be retained within the space between the projection system and the substrate, as desired.

Operating conditions of the apparatus, such as the maximum velocity of the substrate relative to the projection system that may be used, is dependent on the design of the system used to control the immersion fluid. Accordingly, for example, the maximum relative velocity may be determined at which it may be sufficiently confident that the loss of immersion fluid will be minimized to an acceptable level and the immersion lithographic apparatus may be accordingly configured such that this velocity is not exceeded.

It is desirable, for example, to provide a system within which operating conditions can be optimized. For example it may be desirable to provide a system in which the velocity of the substrate relative to the projection system can be maximized.

According to an aspect of the invention, there is provided a device manufacturing method comprising:

projecting a patterned beam of radiation onto a substrate supported by a substrate table using a projection system;

providing an immersion fluid to a space between the projection system and the substrate, the space surrounded by a fluid confinement structure;

determining an operating condition of the fluid confinement structure based on a parameter associated with the substrate table and/or the substrate on which the beam of radiation is to be projected; and controlling the operation of the fluid confinement structure based on the determined at least one operating condition.

According to an aspect of the invention, there is provided an immersion lithographic apparatus comprising:

a substrate table, configured to support a substrate;

a projection system, configured to project a patterned beam of radiation onto a substrate supported by the substrate table;

a fluid confinement structure, configured to control immersion fluid in a space between the projection system and the substrate; and a control system, configured to determine an operating condition of the fluid confinement structure based on a parameter associated with the substrate and/or the substrate table, and to control the operation of the fluid confinement structure based on the determined operating condition.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
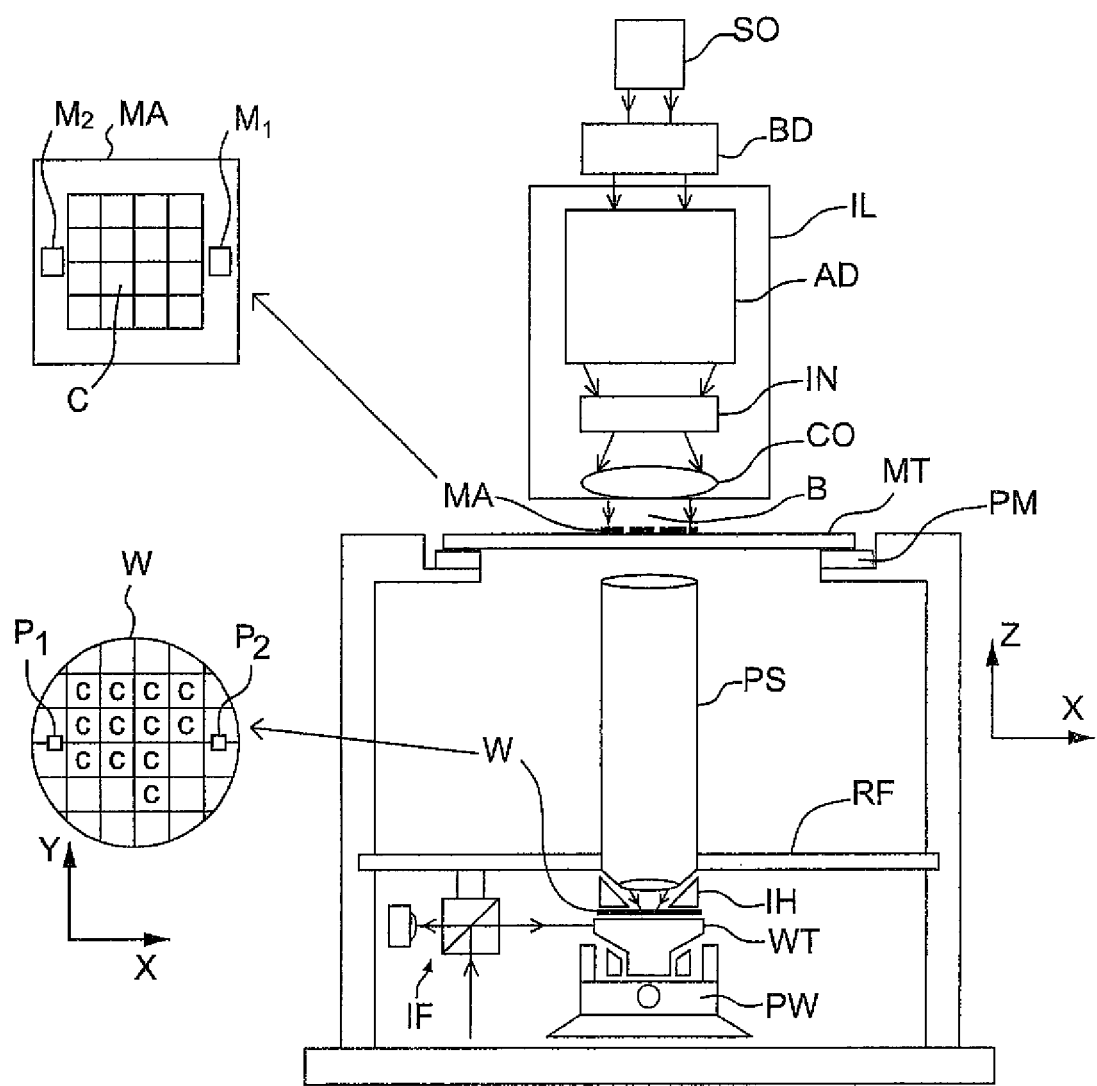
FIG. 1 depicts a lithographic apparatus according to an embodiment of the invention.
Figure 2:
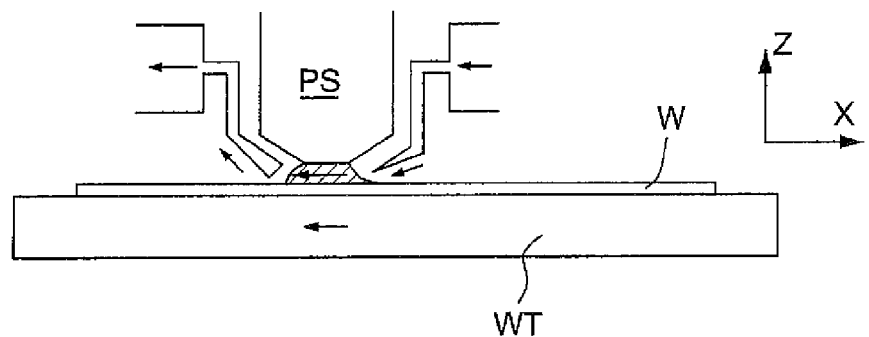
FIGS. 2 and 3 depict a liquid supply system for use in a lithographic projection apparatus.
Figure 3:
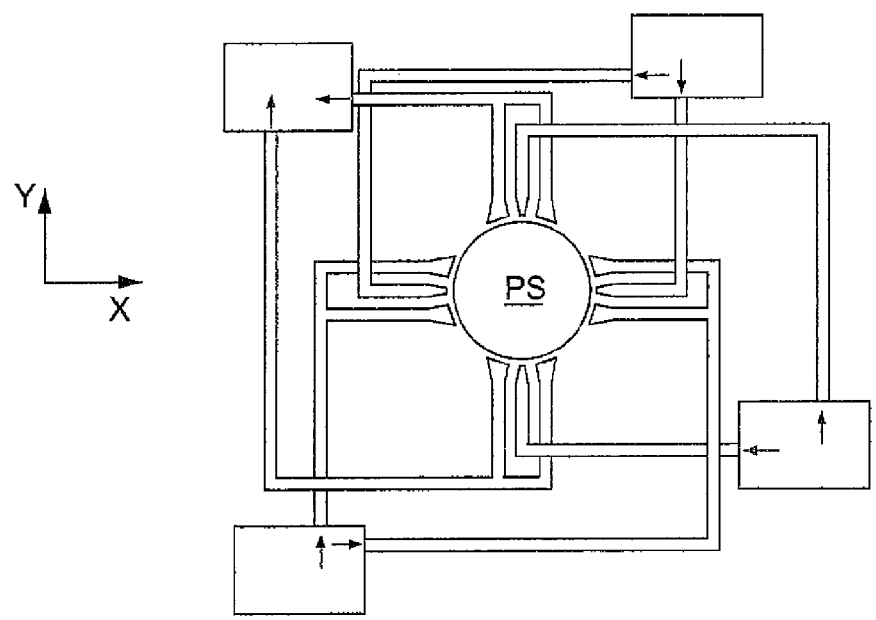
Figure 4:
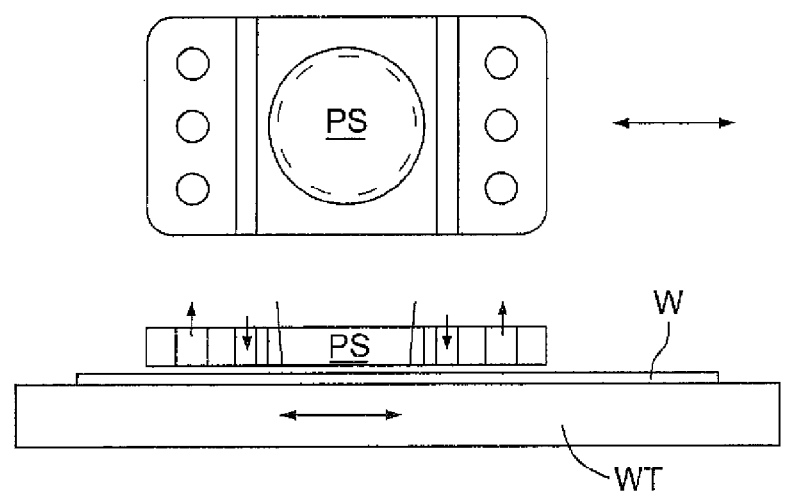
FIG. 4 depicts a further liquid supply system for use in a lithographic projection apparatus.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities; for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section.

The radiation beam B is incident on the patterning device (e.g., mask) MA which is held on the support structure (e.g., mask table) MT and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3: In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate W can be classed into two general categories. These are the bath type arrangement in which the whole of the substrate W and optionally part of the substrate table WT is submersed in a bath of liquid and the so called localized immersion system which uses a liquid supply system in which liquid is only provided to a localized area of the substrate W. In the latter category, the space filled by liquid is smaller in plan than the top surface of the substrate W and the area filled with liquid remains substantially stationary relative to the projection system PS whilst the substrate W moves underneath that area. A further arrangement, to which an embodiment of the present invention is directed, is the all wet solution in which the liquid is unconfined. In this arrangement substantially the whole top surface of the substrate W and all or part of the substrate table WT is covered in immersion liquid. The depth of the liquid covering at least the substrate W is small. The liquid may be a film, such as a thin film, of liquid on the substrate W. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Figure 5:
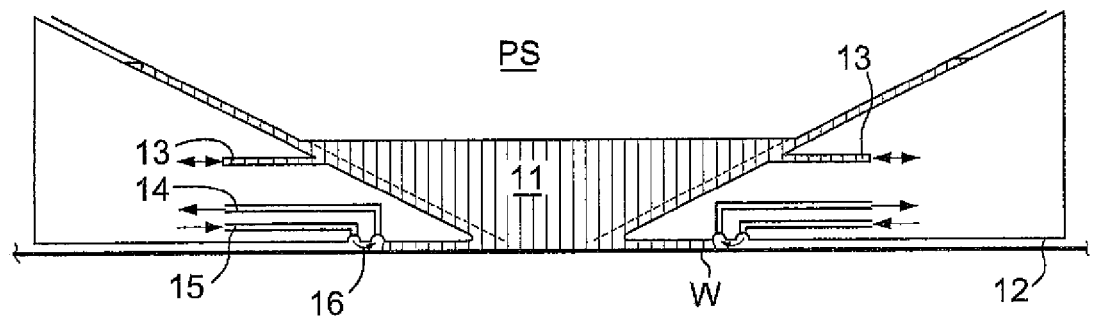
FIG. 5 depicts a further liquid supply system for use in a lithographic projection apparatus.

Another arrangement which has been proposed is to provide the liquid supply system with a fluid confinement member or structure or a barrier member which extends along at least a part of a boundary of the space between the final element of the projection system and the substrate table. Such an arrangement is illustrated in FIG. 5. The fluid confinement structure is substantially stationary relative to the projection system in the XY plane though there may be some relative movement in the Z direction (in the direction of the optical axis). In an embodiment, a seal is formed between the fluid confinement structure and the surface of the substrate and may be a contactless seal such as a gas seal. Such a system is disclosed in United States Patent Application Publication No. US 2004-0207824.

FIG. 5 schematically depicts a localized liquid supply system or liquid handling structure with a fluid confinement structure 12, IT. The fluid confinement structure 12, IH extends along at least a part of the boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The fluid confinement structure 12 is substantially stationary relative to the projection system PS in the XY plane though there may be some relative movement in the Z direction (in the direction of the optical axis). In an embodiment, a seal is formed between the fluid confinement structure 12 and the surface of the substrate W and may be a contactless seal such as a fluid seal, desirably a gas seal.

The fluid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the fluid confinement structure 12 positioned below and surrounding the final element of the projection system PS. Liquid is brought into the space 11 below the projection system PS and within the fluid confinement structure 12 by liquid inlet 13. The liquid may be removed by liquid outlet 13. The fluid confinement structure 12 may extend a little above the final element of the projection system PS. The liquid level rises above the final element so that a buffer of liquid is provided. In an embodiment, the fluid confinement structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by the gas seal 16 which, during use, is formed between the bottom of the fluid confinement structure 12 and the surface of the substrate W. The gas seal 16 is formed by gas, e.g. air or synthetic air but, in an embodiment, N, or another inert gas. The gas in the gas seal 16 is provided under pressure via inlet 15 to the gap between the fluid confinement structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States Patent Application Publication No. US 2004-0207824.

Many other types of liquid supply system are possible. An embodiment of the present invention is not limited to any particular type of liquid supply system. An embodiment of the present invention is optimized for use with an all-wet system in which the liquid between the final element of the projection system and the substrate is unconfined. However, an embodiment of the invention can be used with any other type of liquid supply system.

According to an embodiment of the present invention, the immersion lithographic apparatus is configured to determine an operating condition of the fluid confinement structure, such as a maximum permissible velocity of a substrate and the substrate table supporting it relative to a fluid confinement structure 12, IH that is used to control the immersion fluid.

The operating condition of the fluid confinement structure, such as maximum permissible velocity, may be determined based on one or more parameters that are associated with a substrate on which a beam or radiation is to be projected. This determined value of the maximum permissible velocity (or other operating condition) is then used when controlling the operation of the fluid confinement structure. For example, a maximum permissible velocity may be used when controlling the movement of the substrate and substrate table relative to the projection system during the lithographic process. Such a process may be used to take into account a difference in the nature of different substrates, or of the coating applied to different substrates, such as a layer of resist, a top coat or a layer of resist that does not require a top coat, namely a topcoatless resist, when determining an operating condition of the fluid confinement structure, such as the maximum permissible velocity of the substrate relative to the projection system.

It should be appreciated that the system may determine one or more operating conditions of the fluid confinement structure based on the one or more parameters of the substrate to be exposed. For example, the system may alternatively or additionally set the flow rate of the immersion fluid provided to the space between the projection system and the substrate. Alternatively or additionally, the system may set the level of an underpressure source that is used to extract the immersion fluid from the space between the projection system and the substrate. Alternatively or additionally, in an immersion lithographic apparatus that utilizes a gas knife to control the immersion fluid and, for example, reduce the loss of the immersion fluid, the system may determine the gas flow rate to be used in the gas knife. Alternatively or additionally, in such an immersion lithographic apparatus utilizing a gas knife, the system may determine a desired composition of the gas to be used in the gas knife or a parameter based on the composition, such as the relative humidity. Alternatively or additionally, the system may determine a required size of the separation between the substrate and the fluid confinement structure during the exposure process. Any other operating condition may alternatively or additionally be determined by the system.

Such an arrangement may be beneficial because, in addition to the desired operating condition, such as the maximum permissible velocity, being dependent on the design of the fluid confinement structure 12, LEI, as discussed above, the desired operating condition may be affected by the substrate itself or a coating applied to the substrate. Accordingly, by determining and using an operating condition of the fluid confinement structure that is based on one or more of the parameters associated with the substrate to be exposed, it is possible to optimize the operating condition of the fluid confinement structure and therefore optimize the operation of the lithographic apparatus.

The maximum permissible velocity may be determined for each configuration of the immersion lithography apparatus to ensure that, regardless of the nature of the substrate or the coating used, loss of immersion fluid is kept below an acceptable level. In other words, the maximum permissible velocity is set based on the worst conditions expected for the apparatus, namely for a substrate (and coating) that has the worst effect on immersion fluid loss. However, as a result, in the case of a substrate or substrate coating that is less likely to result in loss of immersion fluid, the substrate could be moved at a greater velocity relative to the projection system than that permitted by the system without significant risk of significant loss of immersion fluid. Similar considerations apply to the setting of any other operating condition of the fluid confinement structure.

The throughput of an apparatus, namely the number of substrates that can be processed within a given time period, is directly affected by the operating condition, such as the maximum permissible scan speed. Accordingly, for a substrate that could be moved faster relative to the projection system than the maximum permissible velocity of the system, the throughput of the system is less than that which is theoretically possible, namely is sub-optimal. Similarly the performance of the lithographic apparatus may be improved by optimizing any other operating condition of the fluid confinement structure.

Therefore, by determining an operating condition, such as a maximum permissible velocity, that takes into account the nature of each substrate and/or the nature of any coating applied thereto, it is possible to improve the performance, for example the throughput, of the lithographic apparatus.

An immersion lithographic apparatus according to an embodiment of the present invention may include a control system configured to determine one or more operating conditions of the fluid confinement structure, such as the maximum permissible velocity of the substrate and substrate table relative to the fluid confinement structure that, together with the projection system, controls the immersion fluid. Based on the determined one or more operating conditions, the operation of the apparatus is controlled such that, for example, the velocity of the substrate and substrate table relative to the fluid confinement structure does not exceed this maximum permissible velocity.

Figure 6:
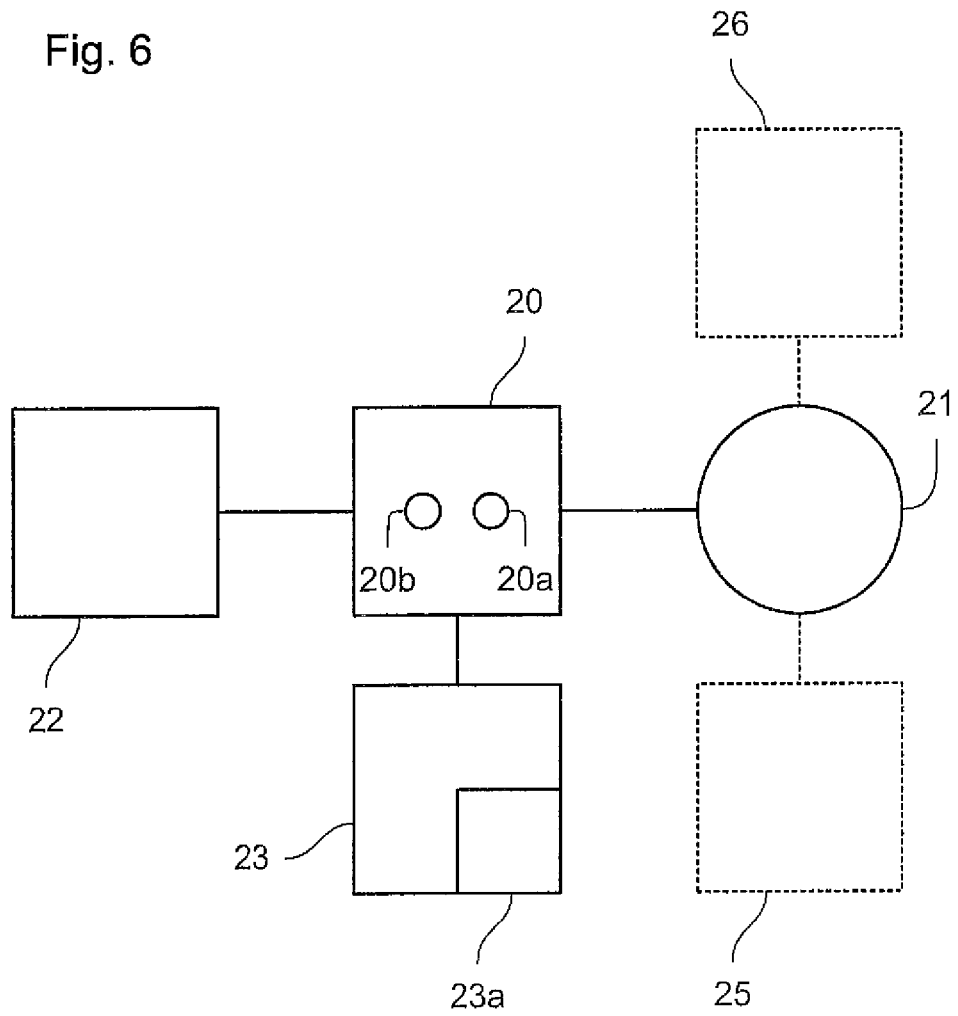
FIG. 6 depicts a schematic arrangement of a control system for an immersion lithographic apparatus according to an embodiment of the present invention.

In particular, as depicted in FIG. 6, a controller 20, including a processor 20a and a memory 20b may be configured to receive a parameter 21 that is associated with a substrate to be processed. The controller 20 may determine an operating condition, for example the maximum permissible velocity for that substrate, by means of a look-up table 22 that stores data relating the parameter to the operating condition, namely in this example the maximum permissible velocity of the substrate relative to the fluid confinement structure. Subsequently, the controller 20, controls the operation of the apparatus 23 based on the determined operating condition. For example, it may control the movement of the substrate and substrate table using an actuator system 23a, ensuring that the velocity of the substrate and substrate table relative to the fluid confinement structure does not exceed the maximum permissible velocity.

The parameter 21 that is used to determine the operating condition, such as the maximum permissible velocity, may, for example, be the contact angle of the immersion fluid on the substrate, or the coating of the substrate.

The contact angle of the immersion fluid on the substrate, or the coating on the substrate, may be generally known for a given substrate and/or substrate coating, subject to some variation for a given substrate and/or substrate coating. A nominal value, corresponding to the expected value of the contact angle, may therefore be known for a given substrate and/or substrate coating. Accordingly, when the immersion lithographic apparatus is being configured ready to perform a process on a given substrate, the controller 20 may be provided with the nominal value of the contact angle as the parameter 21 at the same time as being provided with any other information necessary to configure the lithographic apparatus.

It will be appreciated that, instead, the controller 20 may receive data that is indicative of the substrate and/or coating on the substrate. In that case, the look-up table 22 may directly relate the particular substrate and/or substrate coating type to an operating condition (e.g., maximum permissible velocity) for that lithographic apparatus.

Alternatively or additionally, the controller 20 may receive the parameter 21 in the form of an entry made by a user at a user interface 26.

Alternatively or additionally, the controller 20 may receive data relating to a direct measurement of the parameter 21, such as the contact angle of the immersion fluid on the substrate and/or coating on the substrate. For example, a sensor 25 may be provided to measure the contact angle of the immersion fluid on each substrate (or on the coating of the substrate) before the exposure process takes place. For example, the sensor may be in the form of a camera, such as a CCD camera, that is positioned to image a sample of the immersion fluid placed on the substrate, or coating on the substrate, together with appropriate image analysis software to obtain a measurement of the contact angle. Other presently known forms of fluid contact angle sensor may be used.

Furthermore, it should be appreciated that a sensor may be used to provide direct measurement of one or more parameters associated with the substrate other than the contact angle of the immersion fluid on the substrate and/or coating on the substrate. For example, a levelling sensor may be provided. Such a sensor may measure the surface topography of the substrate and/or coating on the substrate.

Figure 7:
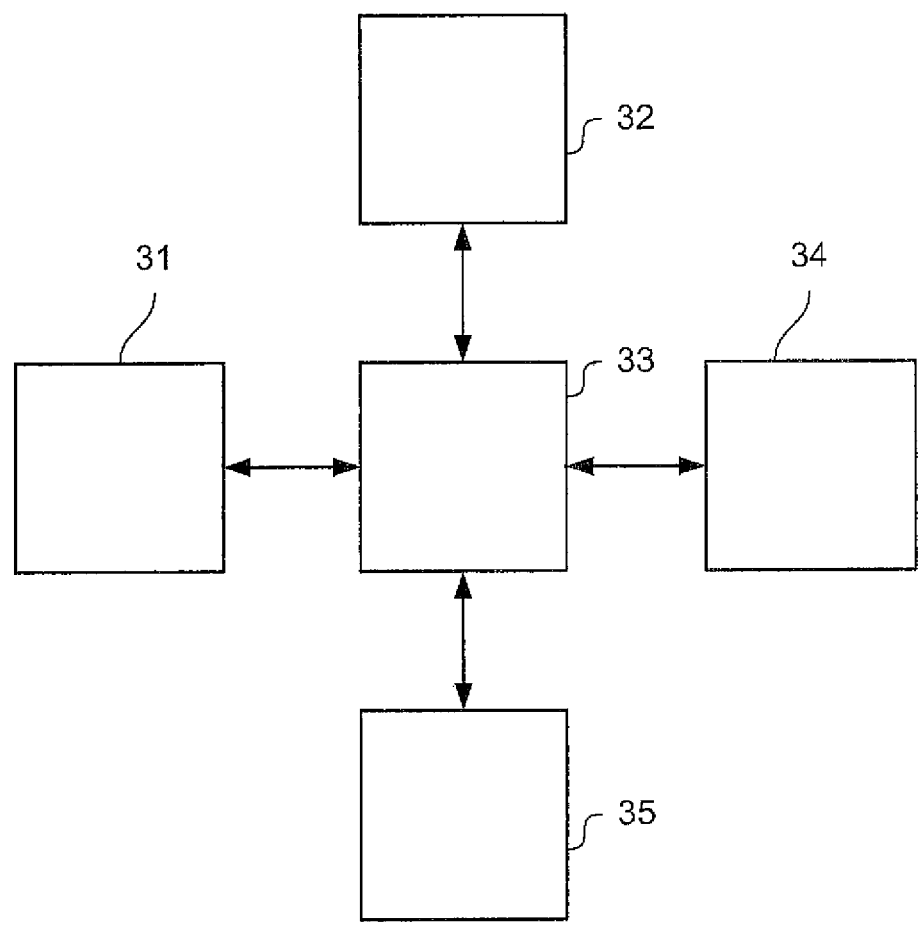
FIG. 7 depicts a schematic arrangement of a lithography system according to an embodiment of the present invention.

A sensor 25, such as a contact angle sensor, may be provided in one or more of a variety of different possible locations within a lithography system, as depicted in FIG. 7.

For example, a sensor 25 may be provided within a system 31 that is configured to process a substrate before and/after exposure in a lithographic apparatus 32. Such a system may, for example, apply a coating to a substrate, may heat the substrate and/or may cool the substrate in a controlled manner.

Alternatively or additionally, a sensor 25 may be provided within a substrate handling apparatus 33 that is configured to convey a substrate within a lithography system. For example, it may be arranged such that the contact angle may be measured shortly before the substrate is provided to the immersion lithographic apparatus 32.

Alternatively or additionally, the immersion lithographic apparatus 32 itself may include a sensor 25.

Alternatively or additionally, a sensor 25 may be included as part of an inspection apparatus 34 that may be provided, for example, to inspect a pattern produced on a substrate during a previous process and/or to compare the overlay of two patterns produced in previous process steps.

Alternatively or additionally, an entirely separate unit 35 may be provided in which to measure the contact angle of the immersion fluid on the substrate and/or coating on the substrate. It will be appreciated that similar considerations apply to the provision of a sensor for any other parameter associated with the substrate.

Figure 8:
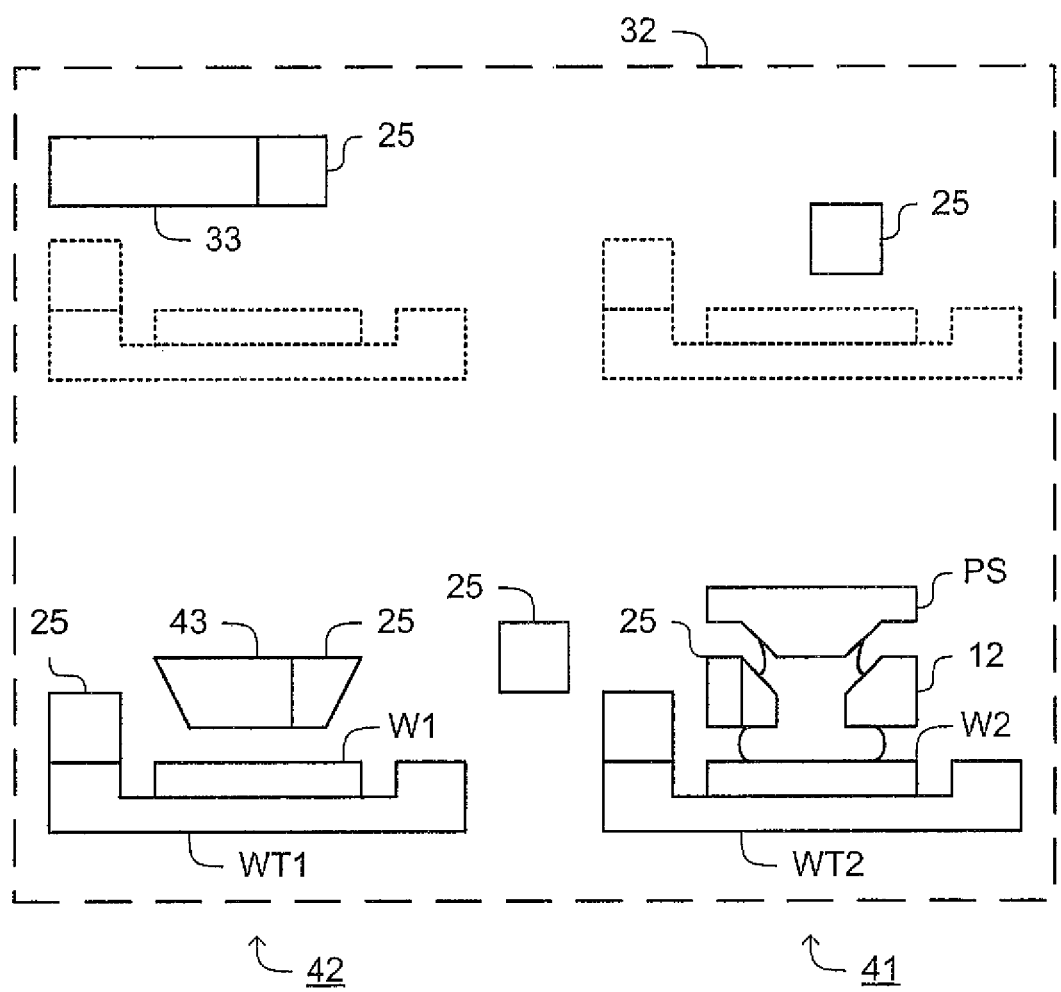
FIG. 8 depicts a schematic arrangement of an immersion lithographic apparatus according to an embodiment of the present invention.

As depicted in FIG. 8, a sensor 25, such as contact angle sensor, may be provided in one or more of a variety of different possible locations within an immersion lithographic apparatus 32.

In the example depicted in FIG. 8, the immersion lithographic apparatus 32 includes an exposure station 41 and a measurement station 42, configured such that while a pattern is being exposed on one substrate W2, measurement processes, such as measuring the position of another substrate W1 relative to a substrate table WT1, can be simultaneously performed. Accordingly, such an apparatus may have two substrate tables WT1, WT2. In such an arrangement, a sensor 25 may be provided together with or as part of a measurement instrument 43 that is part of the measurement station 42.

Alternatively or additionally, a sensor 25 may be provided between the measurement station 42 and the exposure station 41 such that a measurement of the parameter associated with the substrate W1, W2 can be made during the process to transfer the substrate W1, W2 and substrate table WT1, WT2 between the measurement station 42 and the exposure station 41.

Figure 9:
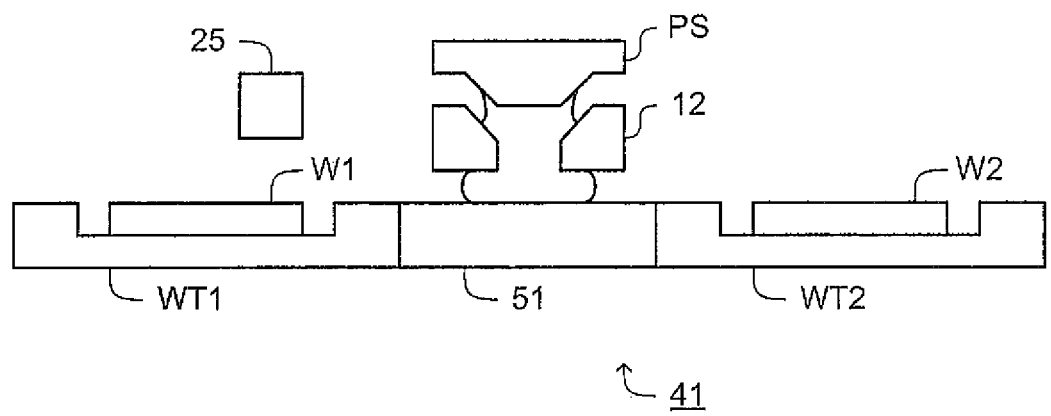
FIG. 9 depicts a schematic arrangement of a part of an immersion lithographic apparatus according to an embodiment of the present invention.

In some arrangements of immersion lithographic apparatus that have two substrate tables, as depicted in FIG. 9, a retractable swap bridge 51 may be provided. The function of such a retractable swap bridge 51 may be to facilitate the process of switching between the processing of a first substrate table WT1 and associated substrate W1 and the processing of a second substrate table WT2 and associated substrate W2 at the exposure station 41. As shown, during the transfer process, the retractable swap bridge 51 is located between the two substrate tables WT1, WT2 and is arranged to provide a continuation of the surface of the two substrate tables WT1, WT2 and associated substrates W1, W2 to pass beneath the fluid confinement structure 12. By use of such an arrangement, it is not necessary to remove the fluid from the fluid confinement structure 12 during the transfer process. Once the transfer is complete, the retractable swap bridge 51 may be retracted such that it does not interfere with the exposure process. In such an arrangement, a sensor 25 may be arranged such that it can measure the parameter associated with a substrate immediately before it is transferred to the exposure station 41 and/or during the transfer process, namely immediately before or during a process to position a substrate such that the patterned beam of radiation can be projected onto the substrate.

Figure 10:
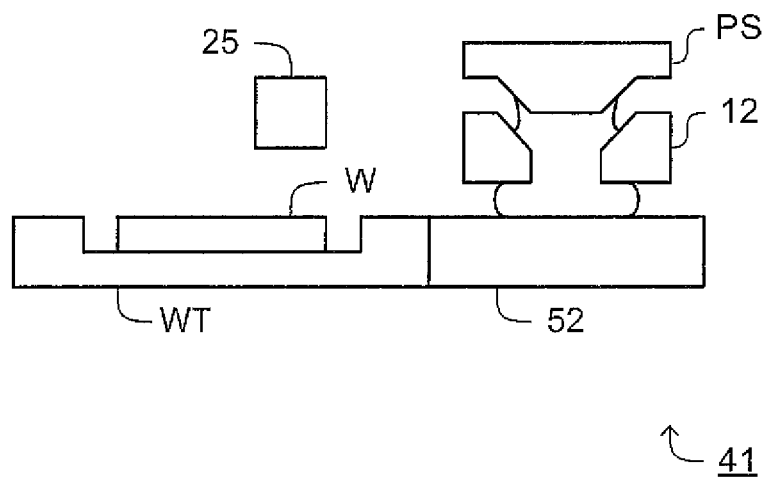
FIG. 10 depicts a schematic arrangement of a part of an immersion lithographic apparatus according to an embodiment of the present invention.

In some arrangements of an immersion lithographic apparatus, as depicted in FIG. 10, a measurement stage 52 may be provided. As shown in FIG. 10, such a measurement stage 52 may be configured to switch with a substrate table WT, which holds a substrate W, at the exposure station 41. Accordingly, for example, while a substrate W is being loaded to the substrate table WT, a substrate W is being unloaded from a substrate table WT or a substrate W is being processed at a measurement station 42, as discussed above, the measurement stage 52 may be provided beneath the fluid confinement structure 12. By use of such an arrangement, it is not necessary to remove the fluid from the fluid confinement structure 12 while, for example, a substrate W is being loaded to the substrate table WT, a substrate W is being unloaded from a substrate table WT or a substrate W is being processed at a measurement station 42. Furthermore, the measurement stage 52 may be configured to perform other functions, such as cleaning, for example, cleaning part of the liquid confinement structure 12, or measurement relating to the performance of the projection system PS. In such an arrangement, a sensor 25 may be arranged such that it can measure the parameter associated with a substrate W immediately before it is transferred to the exposure station 41 and/or during the transfer process, namely before or during the switch with the measurement stage 52 when the substrate W is positioned such that the patterned beam, of radiation can be projected onto the substrate W.

Alternatively or additionally, a sensor 25 may be provided as part of the exposure station 41. In particular, for example, a sensor 25 may be provided associated with or integral to the fluid confinement structure 12 as shown in FIG. 8.

Alternatively or additionally, a sensor 25 may be mounted to or integral with the substrate table WT as shown in FIG. 8. In such an arrangement, the measurement of the parameter associated with the substrate may be made at any convenient time during the process.

Alternatively or additionally, a sensor 25 may be arranged within the lithographic apparatus 32 such that the measurement of the parameter may be made at the location at which the substrate handling apparatus 33 loads a substrate W to the substrate table WT as shown in the top left hand corner of FIG. 8.

Alternatively or additionally, a sensor 25 may be provided at a separate location within the lithographic apparatus 32 such that the measurement of the parameter may take place without interfering with the operation of the measurement station 42 or the exposure station 41 as shown in the top right hand corner of FIG. 8.

It should be appreciated that during operation of a lithography system, a plurality of substrates, typically referred to as a batch, may be successively processed in substantially the same manner. In this case, the immersion lithographic apparatus may be configured to determine the operating condition of the fluid confinement structure, such as a maximum permissible velocity of a substrate relative to a fluid confinement structure, that is used for all of the substrates within a particular batch. Accordingly, for example, if the operating condition is the maximum permissible velocity and it is determined based on a measurement of the contact angle of the immersion fluid on the substrate or substrate coating, a measurement of the contact angle used to determine the maximum permissible velocity for the batch may be performed on one of the substrates. Alternatively, for example, measurements of the contact angle may be made on a plurality or all of the substrates of the batch and the maximum permissible velocity determined, for example, from an average of the measurements. Corresponding possibilities apply for the determining of any other operating condition and the use of any other parameter associated with a substrate.

The nature of the substrate may be different at the edge of the substrate from its nature at, for example, the middle of the substrate. For example, in the central portion of the substrate, only a top coating of the substrate may come into contact with the immersion fluid. In contrast, towards the edge of the substrate, one or more other coating layers, or the substrate itself, may come into contact with the immersion fluid. Accordingly, the immersion lithographic apparatus may be configured such that the controller 20 determines a first value of the operating condition of the fluid confinement structure, such as a first maximum possible velocity of the substrate relative to the fluid confinement structure, based on a parameter of the substrate associated with the central region of the substrate. This first value, for example a first maximum permissible velocity, may be utilized during a phase of the lithographic process when the fluid confinement structure is adjacent to the central portion of the substrate. A second value of the operating condition, for example a second maximum permissible velocity, may be provided for a phase of the lithographic process when the fluid confinement structure is adjacent an edge of the substrate.

Such a second value of the operating condition may be fixed for the immersion lithographic apparatus. Alternatively, for example, the controller 20 may determine the second value of the operating condition for each substrate (or batch of substrates) as above, based on a parameter associated with the edge condition of the substrate.

The controller 20 may be configured to determine the one or more operating conditions of the fluid confinement structure, such as the maximum permissible velocity of the substrate relative to the fluid confinement structure, based on any other relevant parameter associated with the substrate or substrate coating. For example, the operating condition may be determined based on the value of the immersion fluid absorbency of the surface of the substrate or coating on the substrate, the wettability of the surface of the substrate or a coating on the substrate, a chemical property of the surface of the substrate or a coating on the substrate or a physical property of the surface of the substrate or a coating on the substrate. It will be appreciated that different parameters may be used for the determination of different operating conditions.

Any combination of any of the parameters discussed above may be used in order to determine the one or more operating conditions. Likewise, any of the parameters may be measured for each substrate (or batch of substrates) by an appropriate sensor 25 or may be provided to the controller 20 together with the information about a process that is to be performed in order to configure the immersion lithographic apparatus for a given process.

Controller 20 may determine the one or more operating conditions based on the one or more parameters by means other than a look-up table 22. For example, an algorithm may be provided that directly computes the one or more operating conditions based on the values of the one or more parameters provided to the controller 20.

Where a look-up table 22 is provided, the data contained in the look-up table 22 may be provided by, for example, calibration experiments. This information may be determined in advance for each individual immersion lithographic apparatus or may be common for all immersion lithographic apparatus of a particular construction.

Controlling and optimizing the operating conditions is desirable. For example, the operating conditions may be varied and/or adjusted to reduce, prevent or minimize defects from occurring on an exposed substrate. This may be achieved by altering the operating conditions to reduce, prevent or minimize liquid loss from the liquid confinement structure.

Liquid which escapes from the liquid confinement structure may form a droplet. The liquid in the droplet may evaporate to form a drying stain on the substrate.

The droplet may be positioned in a later path of the liquid confinement structure. The interaction of the droplet with the immersion liquid within the liquid confinement structure may form a bubble. It is desirable that the bubble does not enter the optical path of the patterned exposure beam as this could otherwise cause a defect to form on the substrate. The operating condition, such as the liquid supply rate by the liquid confinement structure, may be set to reduce, prevent or minimize such undesirable interactions.

Operation of the liquid confinement structure may cause a part of the coating, such as at the edge of the substrate, to detach from the substrate, for example, in the form of particles or to dissolve into the immersion liquid. The detached particles may be considered contaminating particles which may be a source of defects. The operating condition of the liquid confinement structure may be set to reduce, prevent or minimize the coating loss from the surface of the substrate, for example by limiting the force applied to the substrate by a fluid flow (e.g. liquid and/or gas flow) towards and/or away from the coating.

The routing of the substrate and substrate table relative to the liquid confinement structure and projection system may cause passage of the liquid confinement structure over an edge of the substrate and onto the substrate table. Therefore the operating performance of the liquid confinement structure may be dependent on a surface property of the substrate table surface, such as the contact angle of the immersion liquid relative to the substrate table surface. Therefore, at least one of the sensors described herein may be used to detect a surface property of the substrate table surface. A measurement of the sensor may be used to set the operating condition of the liquid confinement structure in the same manner as for the substrate surface as described previously.

Although a surface property of the substrate table, such as contact angle relative to the immersion liquid, may not change during the exposure of a substrate or a lot of substrates, the sensing of a property of the substrate table may be desirable over a longer time period. The contact angle of the surface of some materials, such as those present on the substrate table which includes those used as coatings, may on occasion alter over time. Such variation could be a consequence of natural aging. A cause may be interaction of the surface material with UV radiation, such as exposure radiation, which may be in the presence of immersion liquid.

Monitoring of the surface property is therefore desirable for optimizing performance, for example, of the liquid confinement structure, or another immersion system aspect such as a gap defined between the surface of the substrate table and the substrate or a shutter member such as a dummy substrate, a closing disk, a surface of a measurement stage or a retractable bridge. A shutter member is used during, for example, substrate swap to confine immersion liquid in the space defined between the liquid confinement structure, the projection system and (during substrate swap) the shutter member.

If the change in surface property is undesirable, for example that the detected surface property exceeds or is less than a certain threshold, the control system connected to the sensing sensor could initiate a warning signal to a user.

Although the above embodiments have been described with reference to a substrate support WT and a substrate W, the invention is not limited to this aspect. For example, an embodiment of the invention could be directed to the mounting of a different object on an object support on a substrate table WT. For example, the object could be a sensor which is supported on a sensor support on the top surface of a substrate table WT.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of one or more computer programs containing one or more sequences of machine-readable instructions describing a method as disclosed above, or one or more data storage medium (e.g. semiconductor memory, magnetic or optical disk) having such one or more computer program stored therein. The one or more different controllers referred to herein may be operable when the one or more computer programs are read by one or more computer processors located within at least one component of the lithographic apparatus. One or more processors are configured to communicate with the at least one of the controllers; thereby the controller(s) operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A device manufacturing method comprising:
    projecting a patterned beam of radiation onto a substrate supported by a substrate table using a projection system;
    providing an immersion fluid to a space between the projection system and the substrate, the space surrounded by a fluid confinement structure;
    measuring a parameter of a surface or coating of the substrate, of the substrate table and/or of a further movable table;
    determining a value of an operating condition of the fluid confinement structure based on the measured parameter;
    determining a further value of the operating condition of the fluid confinement structure based on a further measurement of a parameter of a surface or coating of the substrate, of the substrate table and/or of a further movable table; and
    controlling the operation of the fluid confinement structure based on the determined value of the operating condition and, when the fluid confinement structure and/or the space surrounded by the fluid confinement structure is adjacent an edge of the substrate, based on the further determined value of the operating condition but not the determined value of the operating condition.

2. The device manufacturing method according to claim 1, wherein:
the method further comprises moving the substrate and substrate table relative to the projection system and the fluid confinement structure in order to project a patterned beam of radiation onto different parts of the substrate;
the operating condition of the fluid confinement structure comprises a maximum permissible velocity of the substrate and substrate table relative to the fluid confinement structure; and
controlling the operation of the fluid confinement structure based on the determined value of the operating condition comprises controlling the movement of the substrate and substrate table such that the velocity of the substrate and substrate table relative to the fluid confinement structure does not exceed the value of the maximum permissible velocity.

3. The device manufacturing method according to claim 1, wherein determining the value of the operating condition of the fluid confinement structure comprises using a look-up table to determine a value of a maximum permissible velocity associated with the parameter.

4. The device manufacturing method according to claim 1, wherein the parameter comprises a value of the contact angle of the immersion fluid on the surface or coating.

5. The device manufacturing method according to claim 1, wherein the method comprises projecting a patterned beam of radiation onto a batch that comprises a plurality of substrates; and
further comprising determining the value of the operating condition of the fluid confinement structure for the processing of all substrates in the batch using a value of the parameter that is measured on one or more of the substrates in the batch.

6. The device manufacturing method according to claim 1, comprising measuring the parameter using at least one sensor selected from the following: a sensor configured such that it can perform the measurement while the substrate table and/or further movable table is positioned for the patterned beam of radiation to be projected onto the substrate table and/or further movable table, a sensor configured to perform the measurement while the substrate is supported by the substrate table and is positioned for a measurement station to determine the position of the substrate relative to the substrate table, a sensor configured to perform the measurement immediately before or during a process to position a substrate such that the patterned beam of radiation can be projected onto the substrate, a sensor mounted within a substrate handling apparatus, a sensor mounted within an apparatus configured to inspect a substrate or a sensor mounted within an apparatus configured to at least one selected from the following: apply a coating to a substrate, heat the substrate or cool the substrate.

7. The device manufacturing method according to claim 1, wherein the parameter comprises an indication of the type of coating applied to the substrate, the substrate table and/or further movable table.

8. The device manufacturing method according to claim 1, further comprising receiving an input from a user that corresponds to a value of the parameter; and using the value when determining the value of the operating condition.

9. The device manufacturing method according to claim 1, wherein the parameter comprises at least one selected from the following: a value of the immersion fluid absorbency of the surface or coating, a chemical property of the surface or coating, or a physical property of the surface or coating.

10. The device manufacturing method according to claim 1, wherein the further value of the operating condition of the fluid confinement structure is determined based on a parameter associated with the edge of the substrate.

11. The device manufacturing method according to claim 1, wherein the operating condition of the fluid confinement structure comprises at least one selected from the following: a flow rate of immersion fluid into the space surrounded by the fluid confinement structure, an under pressure used to extract immersion fluid from the space surrounded by the fluid confinement structure, a gas flow rate of a gas knife used in the fluid confinement structure in order to reduce loss of the immersion fluid, a composition of the gas in a gas knife used in the fluid confinement structure or a size of the separation between the substrate, substrate table and/or further movable table and the fluid confinement structure.

12. An immersion lithographic apparatus comprising:
a substrate table, configured to support a substrate;
a projection system, configured to project a patterned beam of radiation onto a substrate supported by the substrate table;
a fluid confinement structure, configured to control immersion fluid in a space between the projection system and the substrate;
a sensor configured to measure a parameter of a surface or coating of the substrate, of the substrate table and/or of a further movable table; and
a control system, configured to determine a value of an operating condition of the fluid confinement structure based on the measured parameter, determine a further value of the operating condition of the fluid confinement structure based on a further measurement of a parameter of a surface or coating of the substrate, of the substrate table and/or of a further movable table, and to control the operation of the fluid confinement structure based on the determined value of the operating condition and, when the fluid confinement structure and/or the space surrounded by the fluid confinement structure is adjacent an edge of the substrate, based on the further determined value of the operating condition but not the determined value of the operating condition.

13. The immersion lithographic apparatus according to claim 12, further comprising an actuator system, configured to move the substrate and substrate table relative to the fluid confinement structure and the projection system; and
wherein the operating condition of the fluid confinement structure comprises a maximum permissible velocity of the substrate and substrate table relative to the fluid confinement structure; and
wherein the control system is configured to control the actuator system such that the velocity of the substrate and substrate table relative to the fluid confinement structure does not exceed the value of the maximum permissible velocity.

14. The immersion lithographic apparatus according to claim 12, wherein the sensor is configured to measure a contact angle of the immersion fluid on the surface or coating; and
wherein the parameter comprises a value of the contact angle measured by the sensor.

15. The immersion lithographic apparatus according to claim 14, wherein the sensor is arranged such that it can measure the contact angle while the substrate table and/or further movable table is in a position in which a patterned beam of radiation can be projected onto the substrate table and/or further movable table.

16. The immersion lithographic apparatus according to claim 14, further comprising a measurement station, configured to measure the position of the substrate relative to the substrate table; and
   wherein the sensor is arranged such that it can measure the contact angle while the substrate and substrate table are positioned for the measurement station to measure the position of the substrate relative to the substrate table.

17. The immersion lithographic apparatus according to claim 12, wherein the further value of the operating condition of the fluid confinement structure is determined based on a parameter associated with the edge of the substrate.

18. The immersion lithographic apparatus according to claim 12, wherein the parameter comprises at least one selected from the following: a value of the immersion fluid absorbency of the surface or coating, a chemical property of the surface or coating, or a physical property of the surface or coating.

19. The immersion lithographic apparatus according to claim 12, wherein the sensor is configured to perform the measurement of the surface or coating at a measurement station to determine the position of the substrate relative to the substrate table.

\* \* \* \* \*